United States Patent [19]

Lum

[11] 4,188,550
[45] Feb. 12, 1980

[54] PHOTODETECTOR CIRCUIT

[75] Inventor: Jackson Lum, Fresh Meadows, N.Y.

[73] Assignee: Medfare, Inc., Westbury, N.Y.

[21] Appl. No.: 847,591

[22] Filed: Nov. 1, 1977

[51] Int. Cl.² ........................................... H03K 17/00
[52] U.S. Cl. .................................. 307/311; 307/300;
250/211 J
[58] Field of Search ............................ 307/311, 300;
250/211 J, 552; 357/2 G

[56] References Cited

U.S. PATENT DOCUMENTS

| | | | |
|---|---|---|---|
| 3,218,462 | 11/1965 | Raab et al. | 307/311 |
| 3,223,938 | 12/1965 | Brook | 307/311 |
| 3,333,106 | 7/1967 | Fischer | 307/311 |

Primary Examiner—Stanley D. Miller, Jr.
Assistant Examiner—B. P. Davis
Attorney, Agent, or Firm—Howard C. Miskin

[57] ABSTRACT

A photodetector circuit which provides both high sensitivity and fast response time by utilizing a coupling circuit connected to a photodetector to reduce the effective value of the stray capacitances between the electrodes of the photodetector. The coupling circuit causes the AC voltages at all of the electrodes to be substantially equal by utilizing a boot-strap action between the various electrodes.

9 Claims, 4 Drawing Figures

PHOTODETECTOR CIRCUIT

BACKGROUND OF THE INVENTION

This invention relates to a photodetector and more particularly to a photodetector circuit which provides both sensitivity and fast response time.

Photodetectors are commonly utilized to sense incident illumination and to produce a response indicating the presence of the illumination. Such photodetectors are utilized in numerous applications such as the detection of encoded patterns, electric eyes, switching devices and others. Various types of photodetectors are presently available including phototransistors, photosensitive field effect transistors and other types of photoresponsive semiconductor devices. In each case, a portion of the semiconductor device receives illumination, typically through a lens, and upon receiving a sufficient amount of illumination, current begins to conduct through the device.

One of the main problems in utilizing photodetectors is to achieve both high sensitivity as well as fast response time. In most situations, an immediate response of the photodetector is required in order to turn on appropriate circuitry, or to provide the necessary effect resulting from the presence of the illumination. As a result, a fast response time is desired to the receiving of illumination. This is especially so, when the photodetector is part of circuitry which is being utilized with computer technology wherein extremely fast speed is needed.

The high sensitivity is also of importance in order to discriminate between the presence of illumination amidst a background field. For example, in detecting encoded markings on a surface, the sensitivity is important in order to discriminate the encoding marks from the background noise. Similarly, a high sensitivity will make a more effective detector for such items as area detectors, scanning devices, etc.

One problem with prior art devices is that high sensitivity and high response times have been considered as incompatibly related features. Specifically, they were considered as being mutually contradictory, and the achievement on one was always at the expense of the other. For example, in order to obtain a high sensitivity of a photodetector, the response time was sacrificed. Conversely, in achieving a fast response time, the sensitivity of the photodetector was sacrificed.

SUMMARY OF THE INVENTION

Accordingly, it is an object of the invention to achieve a photodetector circuit which avoids the aforementioned problems of prior devices.

Another object of the present invention is to provide a photodetector circuit which can achieve both high sensitivity and fast response time.

Still a further object of the present invention is to provide a photodetector circuit which effectively eliminates the stray capacitances of the photodetector device to thereby achieve both high sensitivity and fast response time.

A further object of the present invention is to provide a photodetector circuit including interconnecting circuitry to substantially equalize the AC voltage at the various electrodes of the photodetector device whereby the stray capacitances are substantially eliminated.

Yet a further object of the present invention is to provide a photodetector circuit which utilizes a bootstrap action to cause the AC voltages at all of the electrodes of the photodetector to be substantially equal thereby effectively reducing the stray capacitances between the electrodes.

Briefly, the invention provides a photodetector circuit including a photodetector which has main electrodes and a control electrode. A circuit interconnects the various electrodes of the photodetector to reduce the effective value of the stray capacitances between the electrodes. Such reduction is achieved by causing the AC voltages and all of the electrodes to be substantially equal. In an embodiment of the invention, this is achieved by utilizing bootstrap action between the various electrodes of the photodetector.

The aforementioned objects, features and advantages of the invention will, in part, be pointed out with particularity, and will, in part, become obvious from the following more detailed description of the invention taken in conjunction with the accompanying drawing, which forms an integral part thereof.

DESCRIPTION OF THE PREFERRED EMBODIMENTS

In utilizing a photodetector, it has generally been desired to achieve both high sensitivity and fast response times. However, these two features have generally been opposed to each other and considered incompatible for all photodetector circuits. Heretofore, it has been accepted that the higher the sensitivity, the slower the response time. Conversely, with fast response times the sensitivity was reduced. The reason for this is that the relationship between the sensitivity and the fast response time are inversely related and their relationship is constant. By increasing one, the other is decreased. By way of example, one type of photodetector is a phototransistor and the limit of sensitivity and response time are determined by the base circuit. In a similar manner, when utilizing a photo-field effect transistor, or photofet, the gate circuit provides the limit of such sensitivity and response time.

Figure 2:
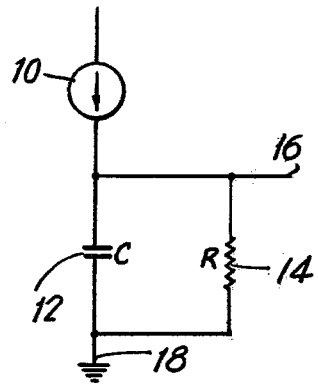
FIG. 2 is an equivalent circuit helpful in explaining the theory of the present invention.

By way of example, reference is made to FIG. 2 which provides a schematic equivalent circuit of a photofet gate circuit wherein the current source 10 represents the photodiode current i, the capacitor 12 represents the total capacitance C coupled to the gate from the drain, the source, the case, the wiring, and other stray capacitances, and the resistor 14 represents the effective resistance R loading the gate. The output gate voltage e is taken from point 16. It is noted that the resistance R and capacitance C are placed in parallel and connected in series with the source 10. The output is taken across the resistor R and capacitance C combination between point 16 and ground 18.

The gate voltage is given by the equation $e = iR/(1+sRC)$, where s is the complex frequency.

Assuming that the photo diode current i is a step function, then $e_{max} = iR$ 1 and the response time constant is $\tau = RC$.

Substituting the aforementioned last two equations into each other there is achieved the following results $e_{max}/\tau = i/c$ which is the merit ratio.

For a given light level which is applied to the photofet, both i and C are fixed quantities. Thus, the value given by the equation $e_{max}/\tau = $ constant As a result, it can be seen that by making $e_{max}$ higher the sensitivity is increased. However, in that case the time constant $\tau$ must be increased in order to maintain the value i/C as a constant. Similarly, by decreasing the time constant and the response time, the sensitivity will be reduced in order to maintain the value i/C as constant.

The only way of improving the sensitivity as well as the fast response time, is either by increasing the quantum efficiency of the photodiode and/or reduce the capacitance.

In practice, circuit designers cannot modify the quantum efficiency of photodetectors, and furthermore hithertofore it has not been available to reduce the stray capacitance of the photodetector. Accordingly, both high sensitivity and fast response time has not been achievable in prior art photodetectors.

Figure 1:
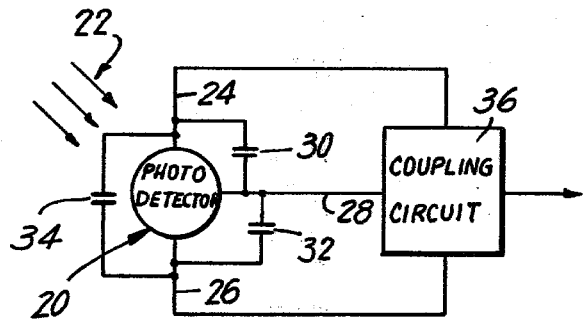
FIG. 1 is a brief schematic drawing explaining the basic concept of the present invention.

Referring now to FIG. 1, there will be shown a photodetector shown generally at 20 which receives illumination 22. The photodetector typically includes main electrodes 24, 26 and a control electrode 28. The control electrode typically receives the illumination and in response causes current to flow through the main electrode.

Stray capacitances typically exist between the various electrodes as shown by the capacitance 30 connected between electrodes 24 and 28, stray capacitance 32 connected between electrodes 26 and 28, as well as stray capacitance 34 connected between electrodes 24 and 26. Additionally, other stray capacitance would exist including the capacitance between the photodetector and ground, and other capacitances. These capacitances are the ones which must be reduced in order to improve both the high sensitivity and fast response time.

The reduction of the capacitances are achieved by utilizing a coupling circuit 36 which interconnects the various electrodes. The coupling circuit serves to make the AC voltages at all of the electrodes to be substantially equal. This effectively reduces the value of the stray capacitances between the electrodes and thereby reduces the total value of the capacitance coupled to the control electrode of the photodetector. By reducing this value, the high sensitivity and fast response time can both be achieved.

Figure 3:
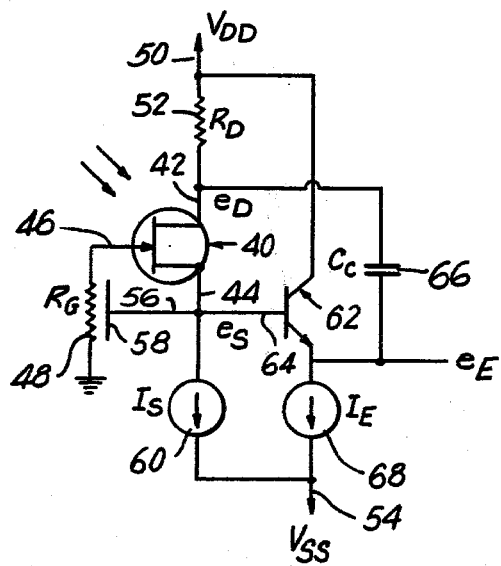
FIG. 3 is a circuit diagram showing one embodiment of the present invention.

Referring now to FIG. 3, there is shown one embodiment of the photodetector circuit including the coupling circuitry which can reduce the capacitances. By way of example, there is shown a photofet 40 having a drain 42, a source 44, and a gate 46. A gate resistor RG is shown at 48 interconnected between the gate and ground. A voltage supply VDD is shown at 50 interconnected through a drain resistor 52 to the drain of the photofet. The source is connected to the voltage source VSS at 54 through a current source 60.

Typically, stray capacitances would exist between the drain and gate, the gate and source, and the source and drain, as well as additional stray capacitances between the case and ground as well as the wiring. The stray capacitances would be the total capacitance which would limit the merit ratio i/C which limits the production of both high sensitivity and fast response time.

In order to reduce these capacitances a bootstrap action is utilized between the various electrodes of the photofet to reduce the capacitances.

The first bootstrap action is the interconnection between the source and the gate circuitry. While no direct connection can be made because such would eliminate the biasing action, a conductive lead 56 is connected at one end to the source 44 and the other end is wound around the gate resistor as shown schematically at 58. In this way, although no direct connection is made between the source and the gate circuitry, nevertheless the AC voltage between the source and gate region are made substantially equal to thereby effectively eliminate the stray capacitance between the gate and the source. The gate to source capacitance is suppressed significantly because the source follower gain is very close to unity. In order to ensure such unity gain, a current source 60 is connected in the source circuit to provide a current $I_S$.

The interconnection between the drain and source is also provided by means of a bootstrap action. However, because of the rather low impedance between the drain and AC ground, it is not possible to directly interconnect them. As a result, an additional emitter follower 62 is interconnected with its base 64 coupled to the source 44, its collector coupled to the source 50 of voltage VDD, and its output taken from its emitter. A coupling capacitor 66 is interconnected between the emitter and the drain in a bootstrap action. In order to maintain the effectiveness of the emitter follower, another current source 68 is placed in the emitter to provide a current $I_E$.

Since the drain voltage is equal to the source voltage, by means of the emitter follower and the coupling capacitor 66, the drain and gate voltage are now made substantially equal. As a result, all of the AC voltages of the gate, drain, and source are made substantially equal, and in this way, the effective value of the stray capacitances between the electrodes are nearly eliminated.

Referring to the circuit, the AC voltage gain from the gate to the drain is readily expressed as $$\frac{e_D}{e_G} = \frac{1}{1 + \left[\frac{I_{DSS}}{I_D}\right]^{\frac{1}{2}} \frac{1}{g_{mo} R_S}} \cdot \frac{1}{1 + \frac{1}{\beta g_m R_E} + \frac{.026}{I_E R_E}}$$

where
$I_{DSS}$ = drain current at $V_{GS} = 0$
$g_{mo}$ = transconductance at $V_{GS} = 0$
$g_m = g_{mo}(1 - V_{GS}/V_p)$; $V_p$ = pin-off voltage of the photofet
$R_s$ = resistance loading the source
$\beta$ = current gain of the BJT
$R_E$ = resistance loading the emitter The effectiveness of the bootstrap action depends on how close $E_D/e_G$ approaches unity. From the above equation, $e_D/e_G \rightarrow 1$ if $I_s$ and $I_E$ are supplied by current sources.

In the above circuit, the gate-to-drain capacitance is bootstrapped out by $e_E \approx e_G$ through $C_c$. The gate-to-source capacitance is suppressed significantly because the source follower gain is very close to unity. The capacitance from the gate to ground through $R_G$ and wirings is bootstrapped by electriccal shields connected to the source of the photofet.

Although the circuitry heretofore described has been with respect to a photofet, it will be evident to those skilled in the art that a similar effect can be achieved when utilizing a phototransistor or other similar type of semiconductor photodetector.

Although by utilizing the emitter follower there is a slight loss of gain, such loss has been of exceedingly minimal value. The performance is tremendously improved. For example, normally there exists a drain to gate capacitance of 30 picofarades. In the present circuit such capacitance has been reduced to an effective value of 0.1 p f. Similarly, the other stray capacitances have likewise been substantially reduced to almost be ineffective.

Figure 4:
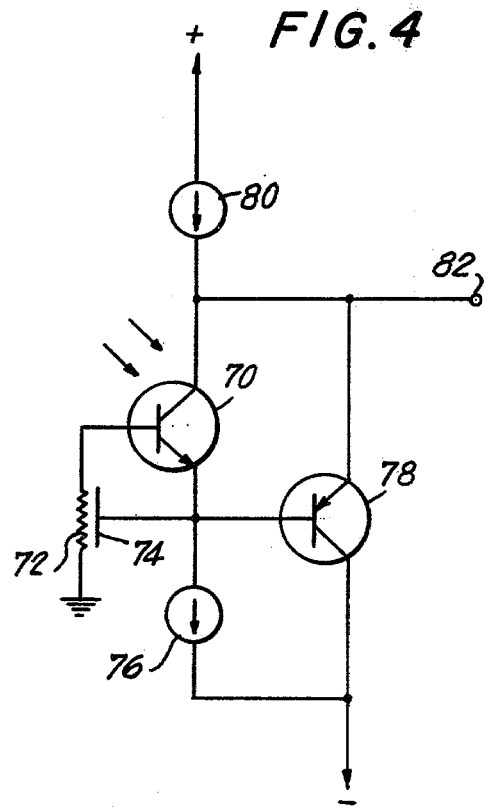
FIG. 4 is a circuit diagram showing another embodiment of the present invention.

Referring now to FIG. 4 there is shown an alternate embodiment of the invention utilizing a phototransistor 70. The phototransistor shown is of the NPN type. The biasing resistor 72 is connected to the base of the transistor and a similar bootstrap arrangement 74 is interconnected between the emitter and base. A constant current source 76 is placed in the emitter circuit. An emitter follower transistor 78 is connected to the output of the phototransistor 70 and is of the PNP type. It will be noted that with the PNP type transistor, the voltage shift is approximately 0.7 volts which is sufficient for the phototransistor to operate. While in connection with the photofet previously described, an additional capacitor and resistor was required to provide sufficient voltage for operation of the photofet, when utilizing the phototransistor, the additional capacitor and resistor can be eliminated and the voltate shift of the transistor 78 is sufficient.

An additional source 80 is provided in the emitter circuit of the transistor 78. The output is taken from the emitter of the transistor 78 at 82.

The operation of the circuit shown in FIG. 4 is substantially the same as that provided for in FIG. 3, with the AC voltages at all of the electrodes of the phototransistor being made substantially equal whereby the stray capacitances are eliminated to a substantial measure.

There has been disclosed heretofore the best embodiment of the invention presently contemplated. However, it is to be understood that various changes and modifications may be made thereto without departing from the spirit of the invention.

I claim:

1. A photodetector circuit comprising,
   photodetector means having first and second main electrodes and a photoresponsive control electrode, and
   circuit means intercoupling said main and control electrodes for effecting a bootstrap action between said control and main electrodes and for substantially equalizing the AC voltages at said main and control electrodes to reduce the effective value of the stray capacitances between the electrodes.

2. A photodetector circuit comprising:
   photodetector means including a photofet having a source, a drain and a gate;
   resistance means coupled to said gate; and
   cicuit means coupled to said photodetector means for effecting a bootstrap action between said source and gate and between said drain and gate for substantially equalizing the AC voltages of and reducing the effective values of the stray capacitances between said drain, source and gate, said circuit means comprising first coupling means for coupling said source to said resistance means to cause the AC voltages at said source and gate region to be substantially equal.

3. A photodetector circuit as in claim 2 and wherein said first coupling means comprises a conductive lead having one end thereof wound around said resistance means and the other end thereof connected to said source.

4. A photodetector circuit as in claim 2 and wherein said circuit means further comprises second coupling means for coupling the source to the drain to cause the AC voltage at the source and drain to be substantially equal.

5. A photodetector as in claim 4 and wherein said second coupling means comprises an emitter follower circuit having its base coupled to the source and its collector coupled to the drain, and a coupling capacitor interconnecting the emitter and the drain.

6. A photodetector circuit as in claim 5 and further comprising current sources coupled to the source and to the emitter.

7. A photodetector as in claim 5 and further comprising electrical shields connected to said source.

8. A photodetector circuit comprising:
   photodetector means including a phototransitor having an emitter, a collector, and a base,
   resistance means coupled to said base; and
   circuit means coupled to said photodetector means for effecting a bootstrap acton between said emitter and base and between said collector and base for substantially equalizing the AC voltages of and reducing the effective values of the stray capacitances between said emitter, collector and base said circuit means comprising first coupling means for coupling said emitter to said resistance means to cause the AC voltages at said emitter and base region to be substantially equal.

9. A photodetector as in claim 8, wherein said first coupling means includes a conductive lead having one end thereof wound around said resistance means and the other end thereof connected to the emitter of the phototransistor and said circuit means comprises a pnp emitter follower having its base coupled to the emitter of the phototransitor.

* * * * *